(12) United States Patent
Anvari

(10) Patent No.: US 7,146,138 B2
(45) Date of Patent: Dec. 5, 2006

(54) POWER BOOSTING TECHNIQUE FOR WIRELESS MULTI-CARRIER POWER AMPLIFIER

(75) Inventor: Kiomars Anvari, 1567 Serafix Rd., Alamo, CA (US) 94507

(73) Assignee: Kiomars Anvari, Alamo, CA (US)

( * ) Notice: Subject to any disclaimer, the term of this patent is extended or adjusted under 35 U.S.C. 154(b) by 433 days.

(21) Appl. No.: 10/689,116

(22) Filed: Oct. 21, 2003

(65) Prior Publication Data
US 2005/0085198 A1    Apr. 21, 2005

(51) Int. Cl.
*H04B 1/04* (2006.01)
*H04B 17/00* (2006.01)

(52) U.S. Cl. .............................. 455/114.3; 455/67.13; 375/297; 330/149

(58) Field of Classification Search ............... 455/63.1, 455/67.11, 67.13, 114.1, 114.2, 114.3, 127.1, 455/571; 375/296, 297; 330/107, 136, 149
See application file for complete search history.

(56) References Cited
U.S. PATENT DOCUMENTS 4,291,277 A * 9/1981 Davis et al. ................. 375/297
5,699,383 A * 12/1997 Ichiyoshi ..................... 375/297
5,877,653 A * 3/1999 Kim et al. .................... 330/149
6,112,062 A * 8/2000 Hans et al. ............... 455/114.3
6,141,390 A * 10/2000 Cova ............................ 375/297
6,246,286 B1 * 6/2001 Persson ....................... 375/296
6,275,685 B1 * 8/2001 Wessel et al. ............... 455/63.1
6,750,710 B1 * 6/2004 Ring ............................ 330/149

* cited by examiner

*Primary Examiner*—Quochien B. Vuong

(57) ABSTRACT

A technique for peak suppressing and pre-distorting the input signal to multi-carrier wireless radio frequency amplifiers to improve the power handling or boost the operating point of the amplifier and subsequently significantly improving the power efficiency of the amplifier is described. The input to the multi-carrier amplifier is modified by a peak suppression and pre-distortion circuit, prior to being applied to the amplifier. The peak suppression and pre-distortion circuit uses a phase generator to create appropriate phase for each carrier to suppress the peak of the multi-carrier signal. The peak suppression and pre-distortion circuit uses samples of the output of the amplifier to adaptively adjust a lookup table that is being used for pre-distortion. The input to the peak suppression and pre-distortion circuit could be a baseband, an intermediate frequency (IF) or radio frequency (RF) signal. The peak suppression and pre-distortion is performed in digital domain at baseband.

15 Claims, 9 Drawing Sheets

POWER BOOSTING TECHNIQUE FOR WIRELESS MULTI-CARRIER POWER AMPLIFIER

BACKGROUND OF INVENTION

The present invention relates to a pre-distortion and peak suppression circuit to boost the out put power of a multi-carrier wireless RF power amplifier. The peak suppression and pre-distortion circuit input could be baseband, intermediate frequency (IF), or RF signal. and its output is the peak suppressed and pre-distorted RF signal as a new input to the amplifier. In any wireless communication system one of the critical components is the power amplifier. This component has a major contribution in cost, power consumption, and size of the system. The main reason is the requirement wireless radio communication system for linear power amplifiers. The higher the linearity, the higher the power consumption, cost and size. In order to minimize the cost, size and power consumption there is a need for techniques that overcome this problem. This invention conquers these challenges by using a simple and accurate peak suppression and pre-distortion module used at the input to the power amplifier.

SUMMARY OF INVENTION

According to the invention, a low-cost RF pre-distortion peak suppression circuit, for use with multi-carrier RF power amplifier, uses a plurality of simple and accurate circuits in conjunction with intelligent signal processing to improve power handling of the multi-carrier RF power amplifier. By intelligent, it is meant that the peak suppression and pre-distortion module has features of adaptability to the environment, such as ability to consider the changes due to environmental changed and aging. The peak suppression and pre-distortion module uses the amplifier input which could be a baseband, an IF or RF signal as its input and condition the input before applying to the multi-carrier amplifier. The conditioning or peak suppression and pre-distortion helps to boost the power handling of the amplifier or acts more linearly. The conditioning is based on pre-defined parameters stored in a lookup table both for peak suppression and pre-distortion. The inputs to the pre-distortion peak suppression should be within a limit that can be handled by the peak suppression and pre-distortion module.

In a particular embodiment, the peak suppression and pre-distortion unit comprises a multi-carrier transmitter and two multi-carrier broadband receivers, a signal processing, and a clock generator. The transmitter and receivers convert the baseband, IF, or RF signal to digital baseband and the digital baseband signal to RF. The signal processor performs the signal conditioning as well as adaptively updating the pre-distortion and peak suppression lookup tables. The signal processor also performs the initial calibration, and timing synchronization as well as transmitter and receivers control.

The invention will be better understood by reference to the following detailed description in conjunction with the accompanying drawings.

DESCRIPTION OF THE SPECIFIC EMBODIMENTS

In a first preferred embodiment the peak suppression and pre-distortion circuit monitors the signal strength of the multi-carrier input signal channels using the input receiver and finds the frequency and channel number of the input signals. In a second preferred embodiment of the invention, the pre-distortion and peak suppression circuit uses sub-harmonic sampling to convert multi-carrier RF or IF signals from its input and the multi-carrier feedback signal from the amplifier to digital baseband signal. In a third preferred embodiment the input signal is conditioned or pre-distorted and peak suppressed using the peak suppression and pre-distortion data stored in a lookup tables before being transmitted to the amplifier. In a fourth embodiment the input signal and the feedback signal from the amplifier are used to adaptively update the pre-distortion lookup table. In a fifth embodiment the digital baseband signal is further down converted to produce the individual carrier baseband signal. In a six embodiment the individual baseband signals are phase rotated using the associated lookup table before being individually filtered and up converted to reconstruct the multi-carrier digital baseband signal. In a seventh embodiment the multi-carrier baseband signal before being applied to peak suppression block and the peak suppressed baseband signal are applied to the phase rotation algorithm block to construct the peak suppression phase rotation lookup table.

Figure 1:
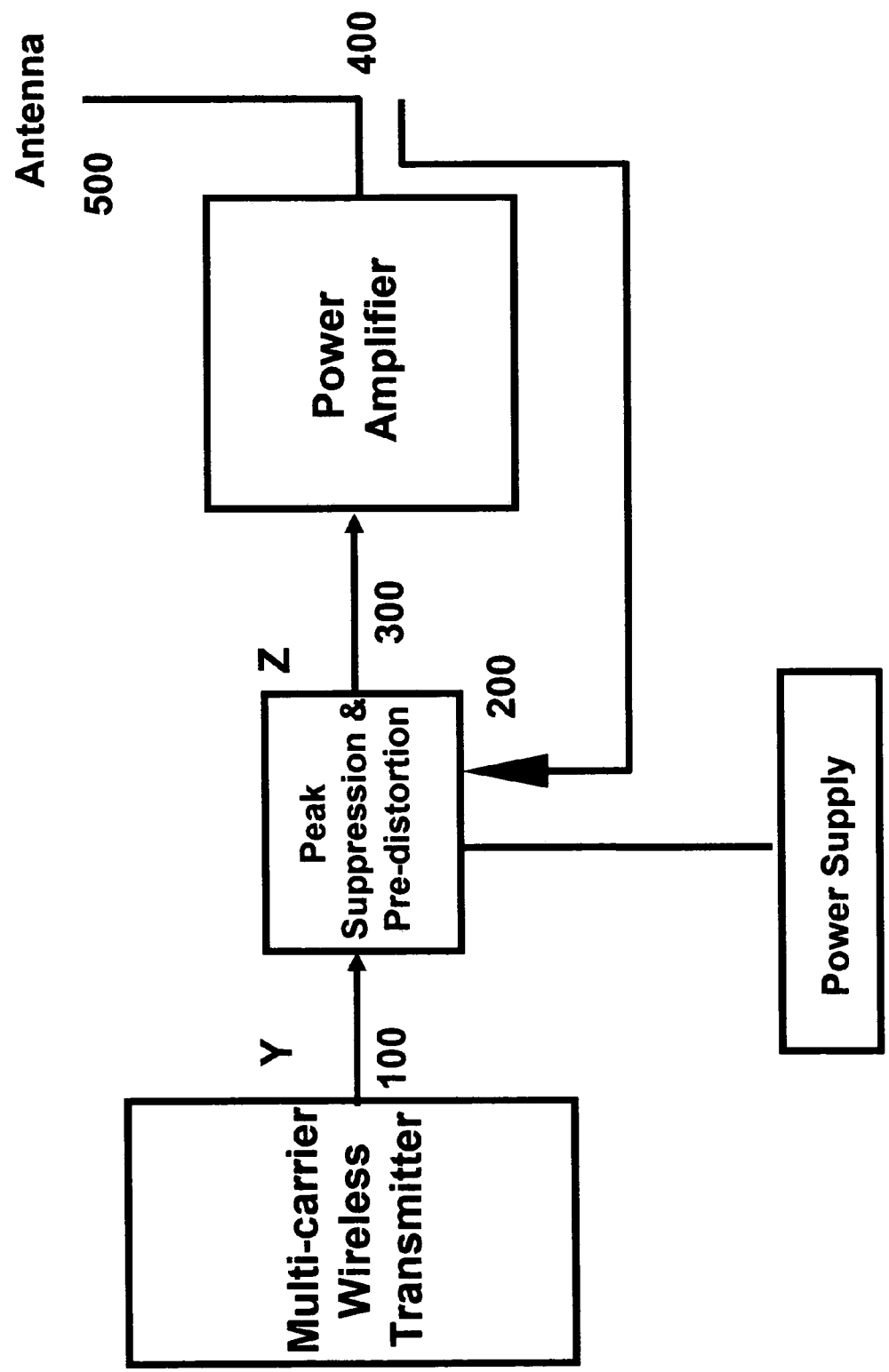
FIG. 1 is an overall block diagram of the a power amplifier with a booster using peak suppression and pre-distortion

Referring to FIG. 1, a peak suppression and pre-distortion circuit diagram is illustrated. The systems receive its inputs from wireless transmitter 100 and feedback from output of the amplifier 200. A sample of the amplifier output 400 is fed back to the peak suppression and pre-distortion circuit. The output of the pre-distortion peak suppression circuit 300 is applied to the input of the power amplifier. The pre-distortion and peak suppression circuit performs the following functions:

1. Find the frequencies and channel numbers of the multi-carrier wireless transmitter output 100.
2. Perform calibration process in order to estimate the timing and initial lookup table values for pre-distortion.
3. Peak suppress and equalize the input signal 100 before applying to pre-distortion.
4. Pre-distort the suppressed and equalized input signal 100 before sending it to the amplifier input 300
5. Use the input signal from the multi-carrier wireless transmitter 100 and the input signal 200 from the output of the multi-carrier amplifier to adaptively up date the lookup table.

6. Use the input signal from the multi-carrier wireless transmitter 100 and the input signal to pre-distortion block to create the phase rotation lookup table
7. Adaptively adjust the gain in the signal paths from main and feedback multi-carrier receivers in DSP2 to an equal and optimal level for further processing.
8. Adaptively adjust the delay of the main multi-carrier receiver signal path in DSP2, until the main and feedback signals are aligned in time/phase. This is measured by cross-correlating between the two signals.
9. Select the best sample value by changing the decimation filter coefficients. This allows the delay to be adjusted to a small fraction of input signal symbol period.

Figure 2:
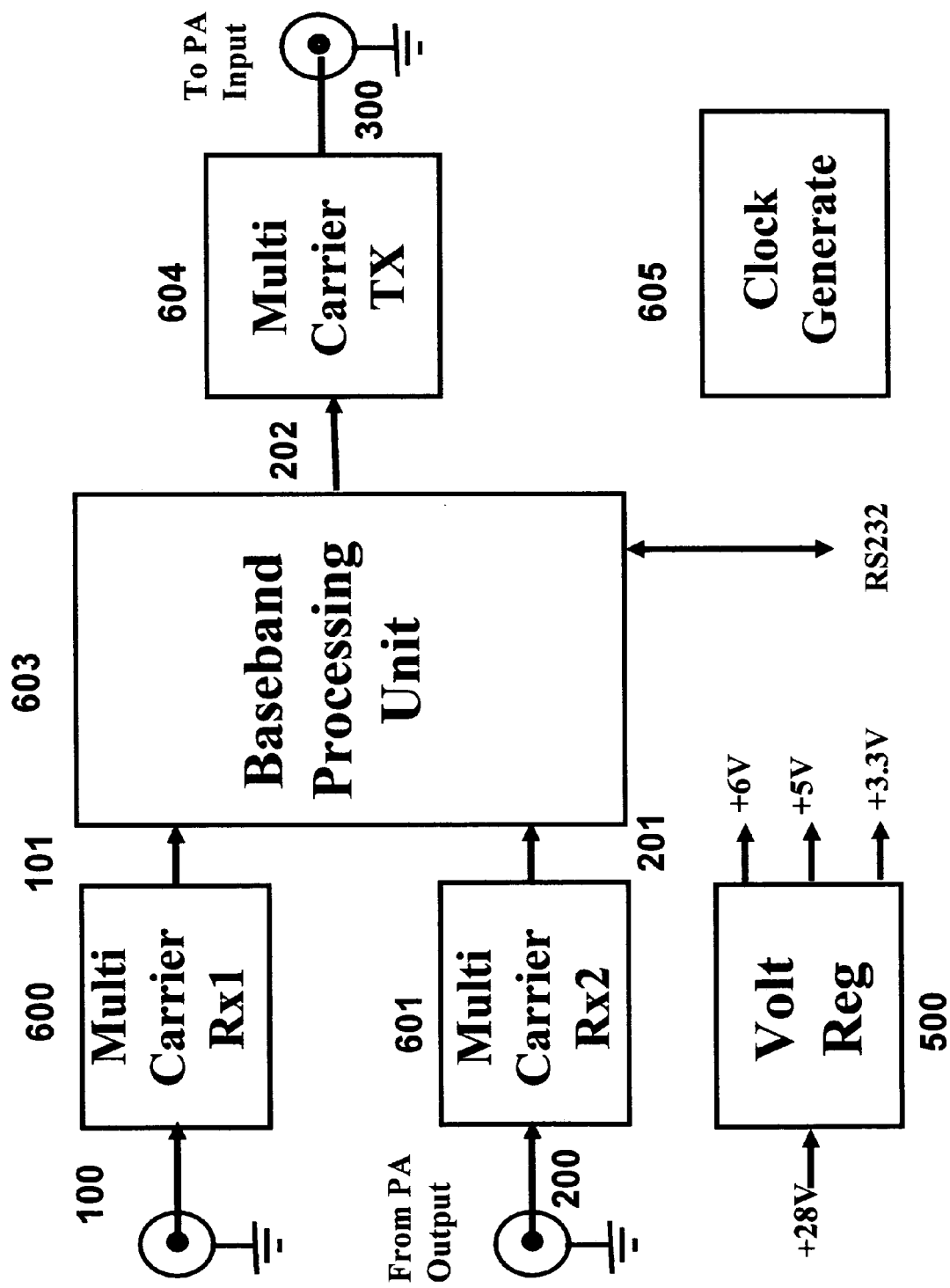
FIG. 2 is the block diagram of the peak suppression and pre-distortion module

FIG. 2 illustrates the detail block diagram of the peak suppression and pre-distortion circuit unit. The received signal from multi-carrier wireless transmitter 100 and the feedback signal 200 from output of the multi-carrier amplifier are applied to multi-carrier receivers 600 and 601. The output of the multi-carrier receivers 600 and 601 are applied to signal processing block 603 for digital signal processing which are peak suppression and pre-distortion, creation of the phase rotation lookup table for peak suppression, and adaptation and updating of the pre-distortion lookup table. The output of signal processing block 603 the peak suppressed and pre-distorted signal 202 is applied to multi-carrier transmitter 604 to create the input signal 300 for the multi-carrier power amplifier. Clock generator 605 produces all the clocks necessary for the pre-distortion circuit and the power supply block 500 produce all the voltages necessary for the pre-distortion circuit.

Figure 3:
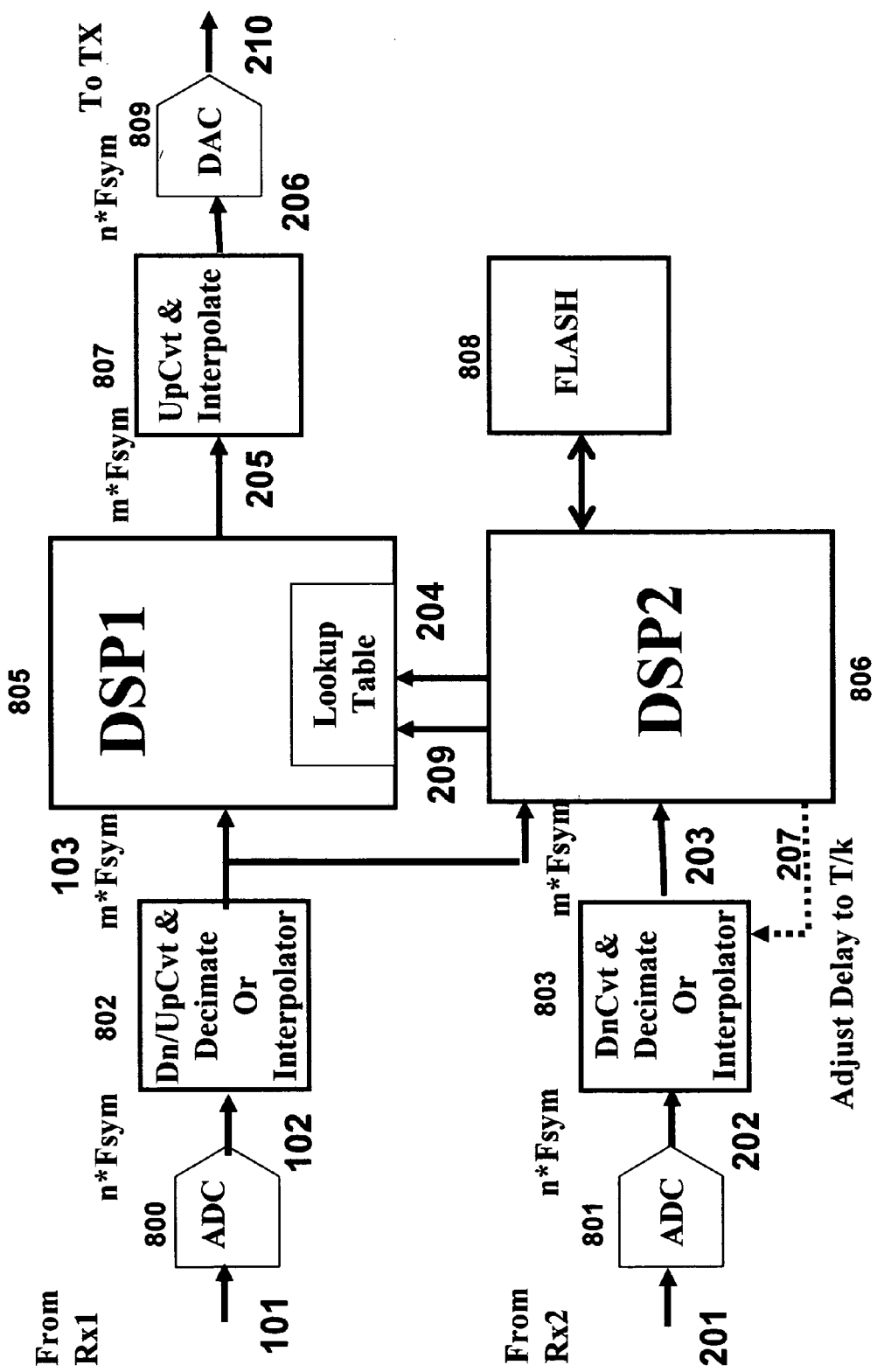
FIG. 3 is the block diagram of the baseband processing unit of peak suppression and pre-distortion module

FIG. 3 shows the detail block diagram of the peak suppression and pre-distortion signal processing block 603. The receiver block 600 output 101 is applied to analog to digital converter (in case the signal is RF, IF, and baseband) block 800 to produce the digital signal 102. The receiver block 601 output 201 is applied to analog to digital converter (in case the signal is RF or IF, baseband) block 801 to produce the digital signal 202. In both cases (if the signal is RF or IF) the analog to digital conversion is based on sub-harmonic sampling. The output of the analog to digital converter 800 is applied to the down/up converter block 802 to produce down converted and decimated (multi-carrier baseband) signal 103 which is m times the symbol rate of the input signal 100 applied to receiver 600. In case the signal is a multi-carrier baseband signal the down/up converter function will not be used, however the baseband signal may need to be interpolated or decimated to produce the right number of samples per symbols. If the signal is baseband but in bit format the up conversion function of 103 is used. The signal is converted to symbol domain with desired samples per symbol first and then each channel is up converted to its baseband frequency to produce multi-carrier baseband signal 103. The output of the analog to digital converter 801 is applied to the down converter block 803 to produce down converted and decimated multi-carrier baseband signal 202 which is m times the symbol rate of the input signal 200 applied to receiver 601.

Figure 4:
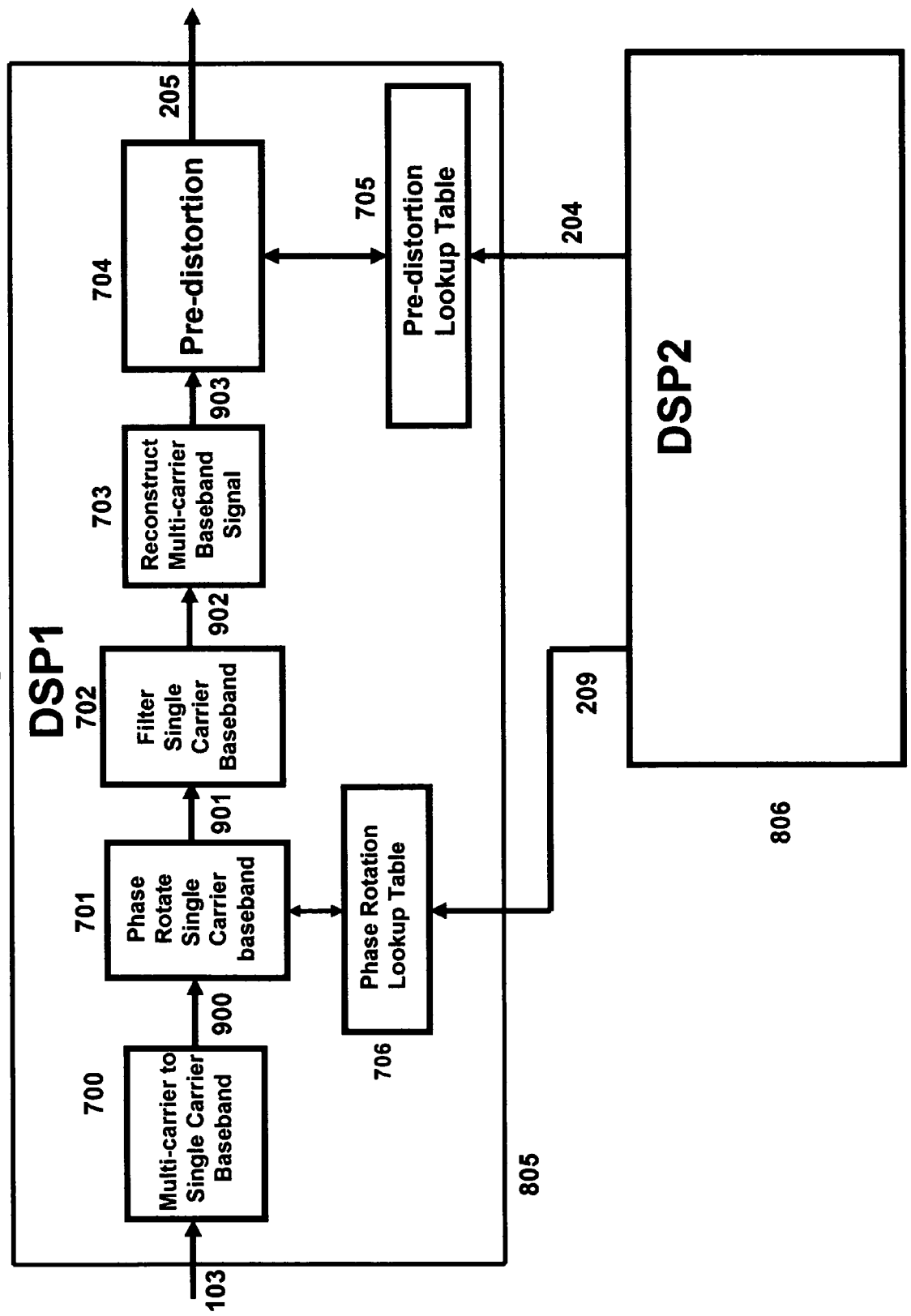
FIG. 4 is the block diagram of the digital signal processing block performing the peak suppression and pre-distortion

FIG. 4 shows the detail block diagram of the peak suppression and pre-distortion signal block 805. The multi-carrier baseband signal 103 from the main multi-carrier receiver is converted to single carrier baseband signals by block 700 to produce the baseband representative of each individual carrier. The single carrier baseband signal 900 then is phase rotated according to an specified phase by a pre-defined phase in block 701. The pre-defined phase is taken from the peak suppression lookup table block 706. The data in lookup table 706 is generated by the phase rotation creation algorithm block 127 in DSP2 block 806. The individual phase rotated single carrier baseband signals 901 are filtered by filter block 702 to produce the phase rotated and filtered signals 902. The phase rotated and filtered signals 902 are applied to block 703 to reconstruct the multi-carrier baseband signal 903. The signal 903 is then applied into the pre-distortion block 704 to produce the peak suppressed and pre-distorted signal 205 using the data from lookup table 705. The data in lookup table 705 are adaptively updated by DSP2 block 806.

The multi-carrier baseband signal 103 is applied to digital signal processing block 805 to produce a peak suppressed and pre-distorted signal 205 using the data stored in the lookup tables. This signal 205 is then interpolated and up converted by block 807 and the signal 206 is produced. The signal 206 is applied to digital to analog converter 809 and signal 210 is produced at the output.

The multi-carrier baseband signal 203 and 103 are both applied to digital signal processing block 806. The digital signal processing block 806 uses these signals to update the pre-distortion lookup table. The block 808 stores the code for all the digital signal processing functions.

The multi-carrier baseband signal 203 and 903 are both applied to digital signal processing block 806. The digital signal processing block 806 uses these signals to create the phase rotation lookup table.

Figure 5:
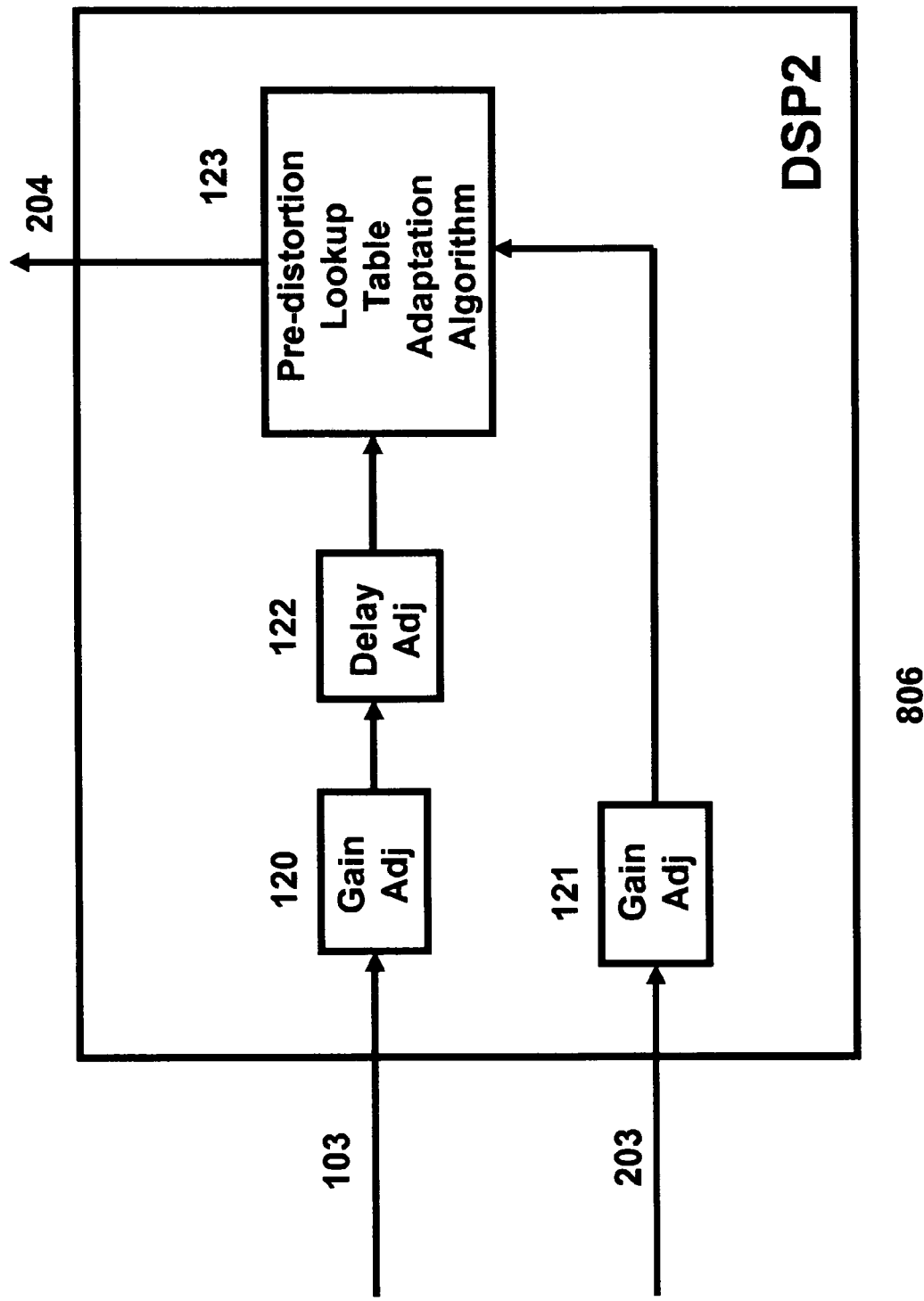
FIG. 5 is the block diagram of the look up table adaptation algorithm

FIG. 5 shows the detail block diagram of the lookup table adaptation algorithm. The multi-carrier baseband signal 103 from the main signal receiver is gain adjusted by 120 and delay adjusted by 122 and then applied to look up table adaptation algorithm 123. The feedback multi-carrier baseband signal 203 from the feedback signal receiver is gain adjusted 121 before being applied to lookup table adaptation algorithm 123. The adaptation algorithm 123 uses the two signal to produce the update values for the lookup table 705. The adaptation algorithm can use one of the existing prior art techniques.

Figure 6:
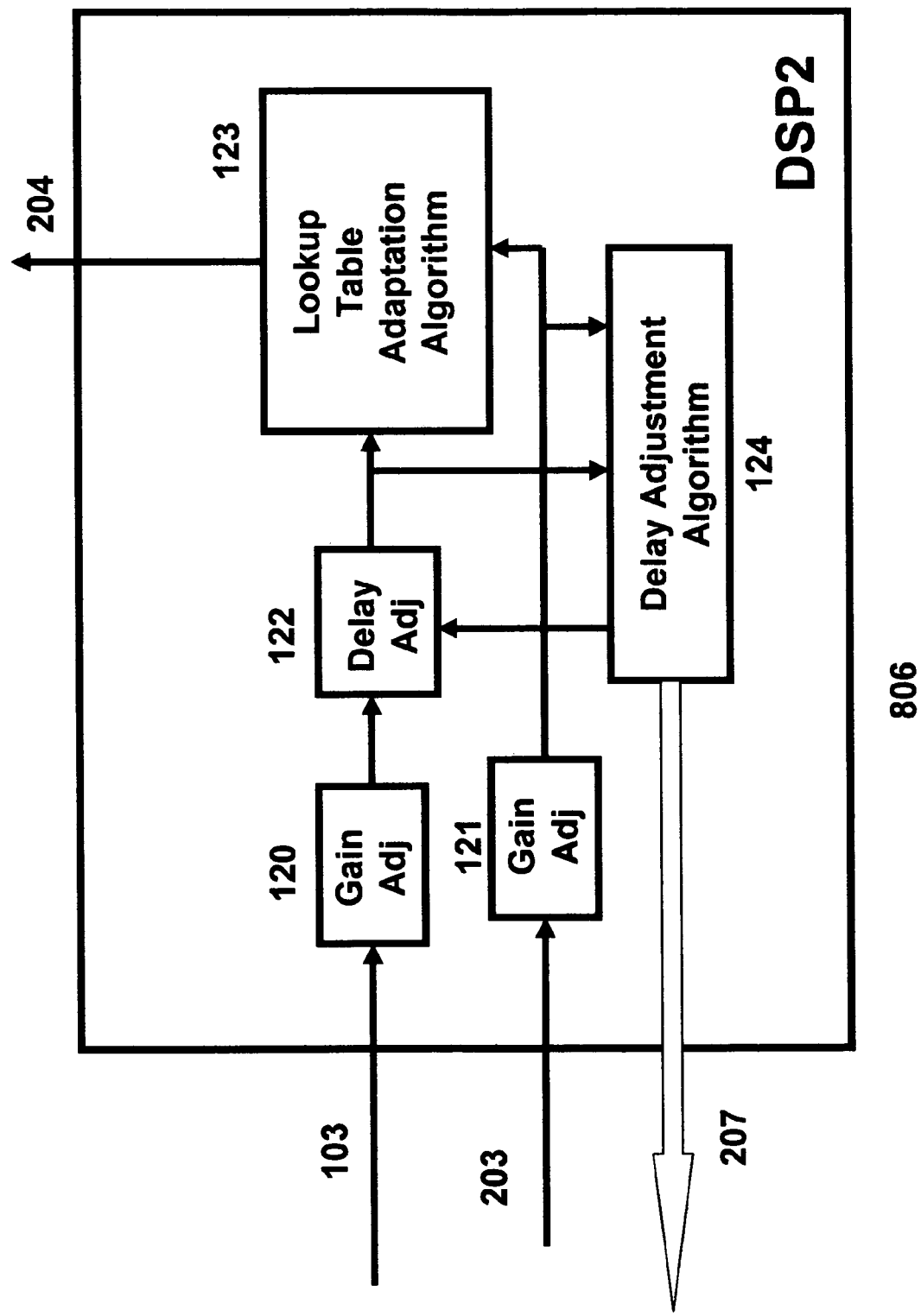
FIG. 6 is the block diagram delay adjustment algorithm

FIG. 6 shows the detail block diagram of the delay adjustment algorithm. The algorithm n operates in two modes. During the initial mode the initial delay between main signal from the main receiver 600 and the feedback signal from the feedback receiver 601 is calculated. During this mode the signal 103 is replaced with a known sequence with very high auto-correlation. The signal input 203 to DSP2 will be decimated to m times the symbol rate, with a sampling phase resolution at minimum of 1/k times the symbol period by block 803. The sampling phase is repeatedly adjusted in increments of 1/k of the symbol period and correlated with known sequence 103 in block 124 to determine the delay present to a high degree of precision required by the lookup table adaptation algorithm in block 123. In operation, this delay will be compensated for by digitally delaying the signal from input 103 of DSP2 by an integer number of samples in block 122, and adjusting the sampling phase of the decimator in block 803 based upon the delay measurement results obtained in block 124 using the delay adjustment algorithm which is based on correlation of the output of blocks 122 and 121. In operation lookup table adaptation algorithm 123 then operates upon the output signal 100 from the wireless multi-carrier transmitter and the feedback multi-carrier signal 200 from the amplifier output, which are precisely aligned in time and phase relative to each other. This adjustment is adaptively maintained during operation, to compensate for any delay variations caused by amplifier properties changing with aging effect and temperature variation.

Figure 7:
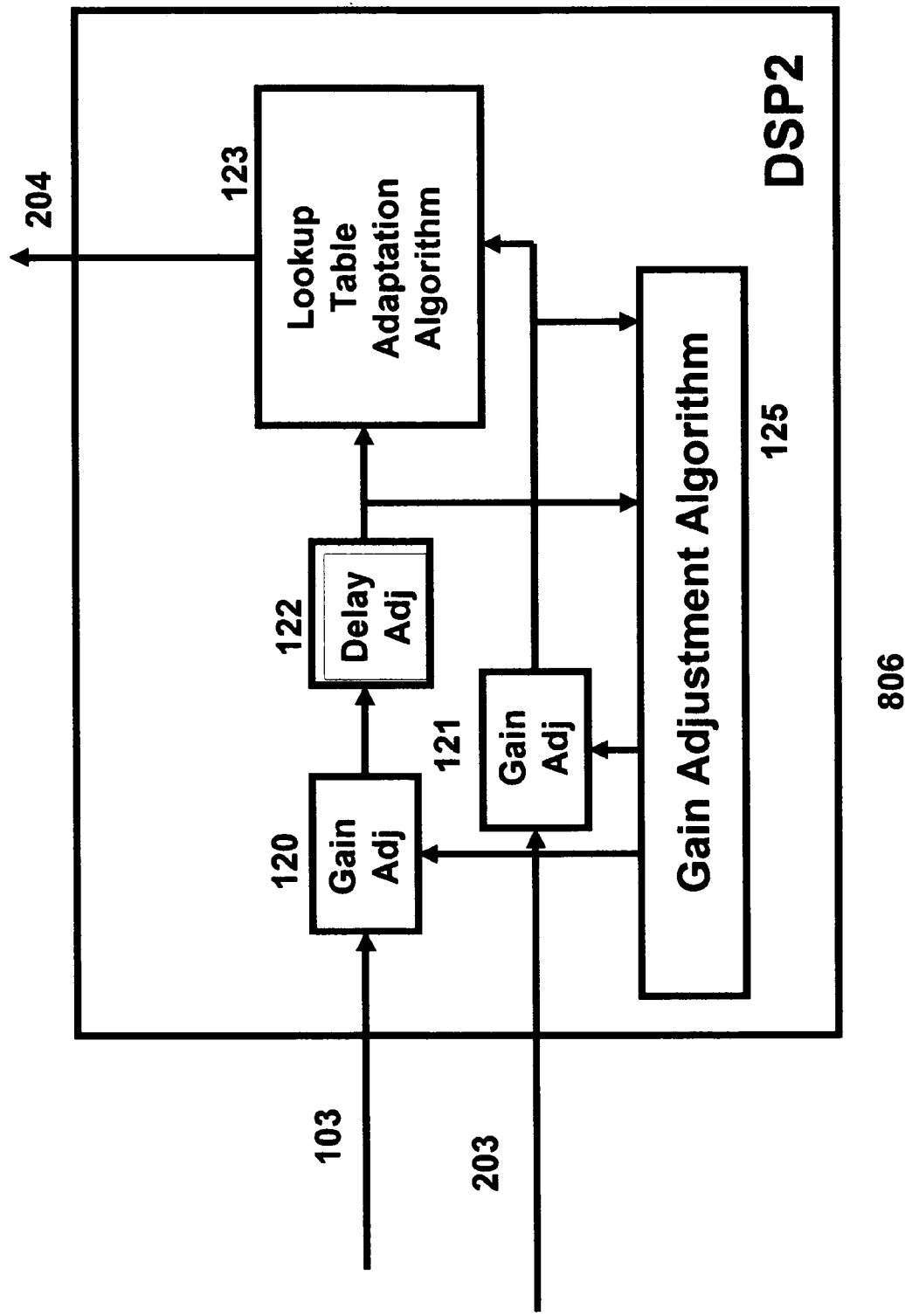
FIG. 7 is the block diagram of the gain adjustment algorithm

FIG. 7 shows the gain adjustment procedure in the path of the two inputs 103 and 203 to the lookup table adaptation algorithm block 123. Block 125 the gain adjustment algorithm gets its input from the output of the blocks 121 and 122. The automatic gain control operation with common set-point which is performed by block 125 adjust the gain in blocks 120 and 121, which allow the lookup table adaptation algorithm to operate in signals of known and common amplitude level. The dynamic range requirements of the algorithm are therefore reduced. This automatic gain control operation is not performed upon the main input signal to DSP1.

Figure 8:
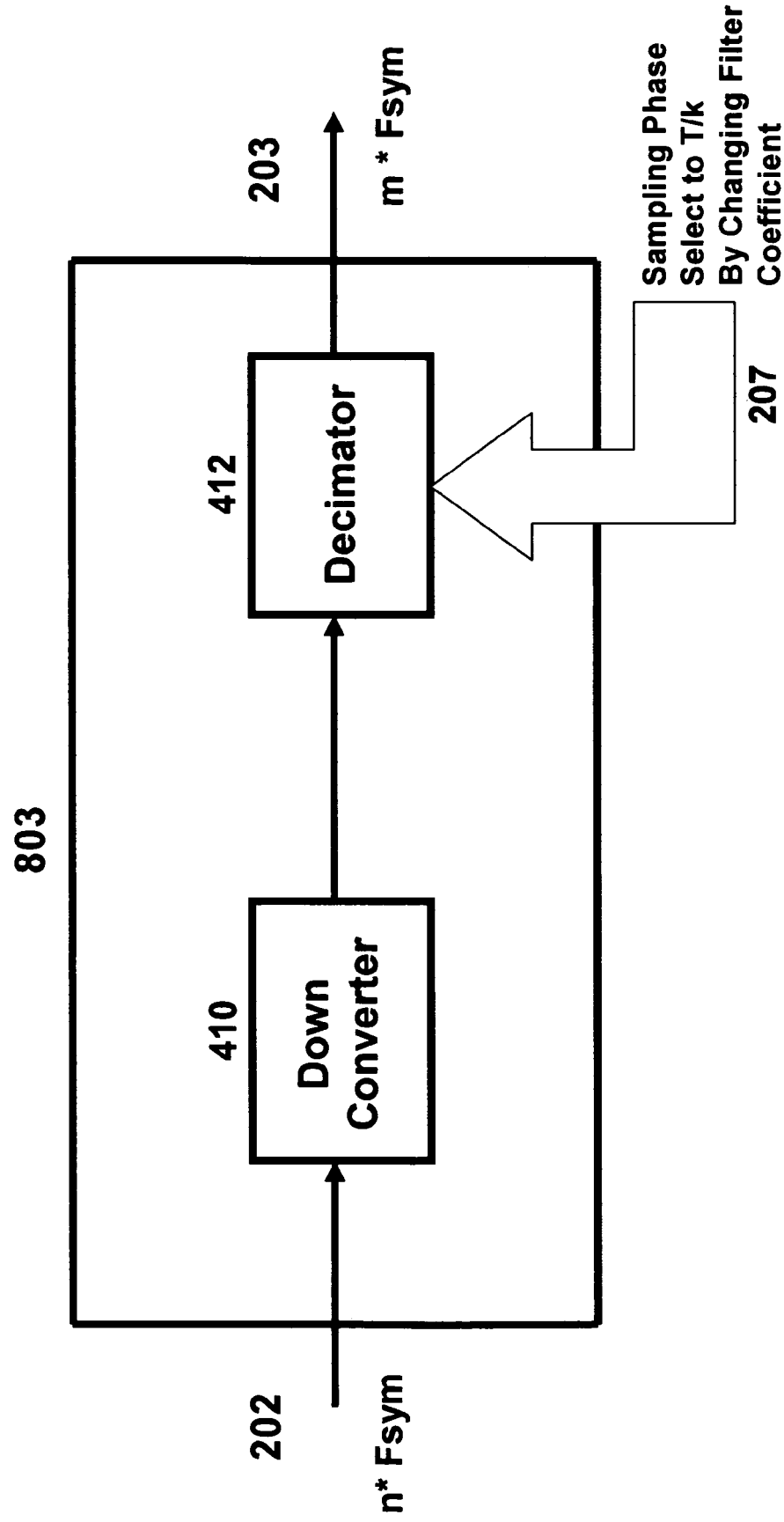
FIG. 8 is the block diagram of sample selection

FIG. 8 shows the down/up converter decimator block diagram of 803, which is used for delay adjustment of the two inputs into the lookup table adaptive algorithm. The decimator filter coefficients are changed based on the delay adjustment algorithm block 124 output 207 to produce phase change steps of T/k.

Figure 9:
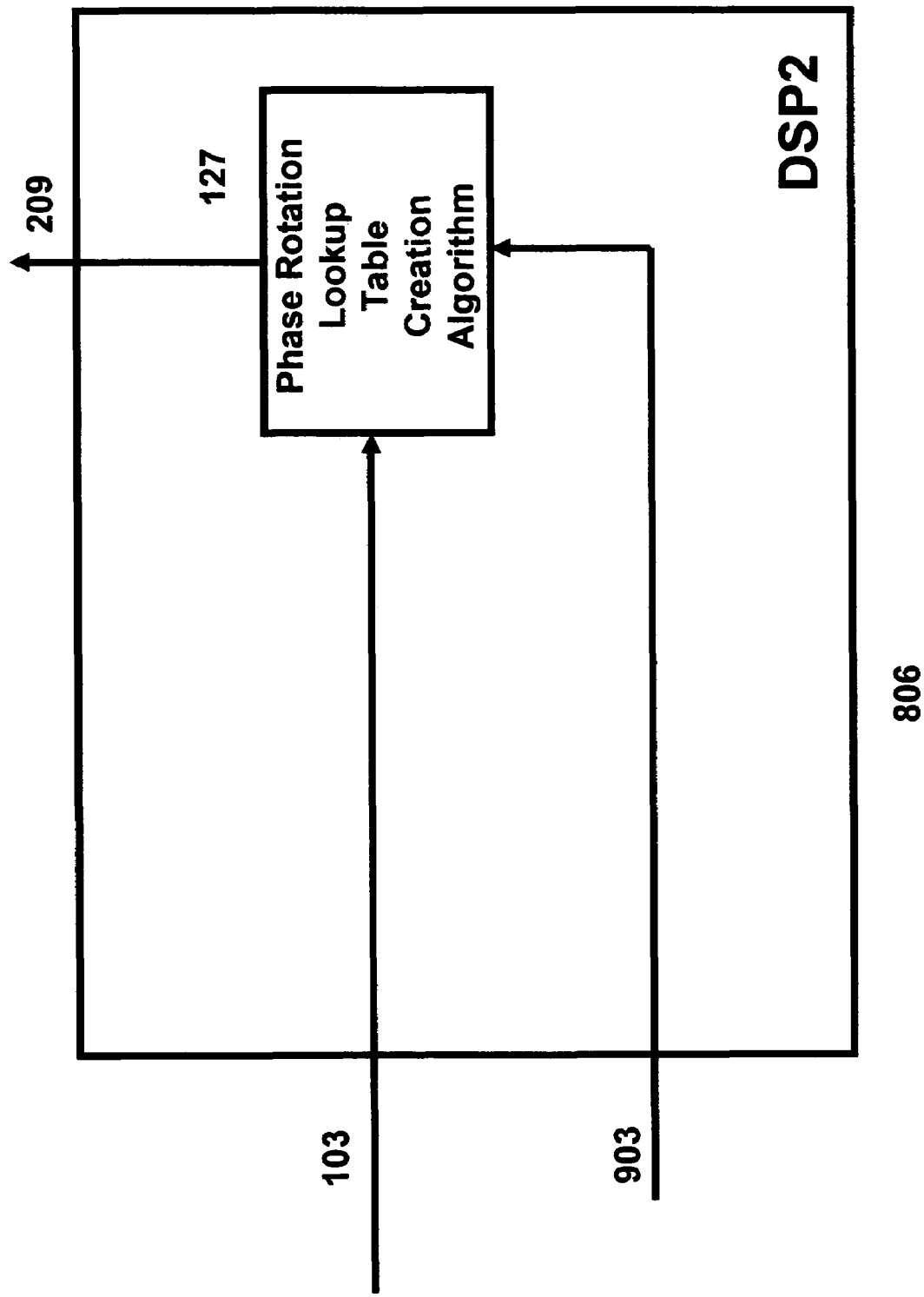
FIG. 9 is the block diagram for phase rotation lookup table creation algorithm

FIG. 9 shows the block diagram of the phase rotation lookup table creation algorithm. The signal 103 and 903 are applied to the phase rotation lookup table creation algorithm block 127. Block 127 uses these two signal to create the phase rotation lookup table values based on the amplitude of the input signal 103.

What is claimed is:

1. A wireless peak suppression and pre-distortion circuit for use with multi-carrier power amplifiers in a wireless communication system to enhance the linearity and performance of the amplifier, in wireless cellular, PCS, wireless LAN, line of sight microwave, military, or satellite communication systems, the peak suppression and pre-distortion circuit comprising:
    two multi-carrier receivers one for the peak suppression and pre-distortion main IF or RF signal input and one for amplifier feedback input; wherein when the main signal is baseband then the main multi-carrier receiver is bypassed;
    a digital signal processing block to peak suppress and pre-distort the main multi-carrier input signal using lookup tables;
    a digital signal processing block to use the main multi-carrier input signal and amplifier feedback multi-carrier input to adaptively update the pre-distortion lookup table;
    a digital signal processing block to use the input and the output of the peak suppression to produce the phase rotation lookup table;
    a digital signal processing block to evaluate the delay between the main multi-carrier signal and the amplifier multi-carrier feedback signal and adjust the main signal delay before being used by the lookup table adaptation algorithm;
    wherein the algorithm will continuously adjust the delay during the operation;
    a digital signal processing block to evaluate the gain between the main multi-carrier signal and the amplifier multi-carrier feedback signal and adjust the both signal's gain before being used by the lookup table adaptation algorithm wherein the algorithm will continuously adjust the gain during the operation;
    a digital signal processing block to accurately evaluate the delay between the main multi-carrier signal and the amplifier multi-carrier feedback signal by changing the coefficient of a decimation filter used in the path of amplifier feedback signal to produce T/k accuracy; and
    a multi-carrier transmitter block that prepare the peak suppressed and pre-distorted main multi-carrier signal for delivery to multi-carrier power amplifier.

2. The peak suppression and pre-distortion circuit according to claim 1, wherein main multi-carrier input signal from the wireless transmitter is sampled using sub-harmonic sampling technique at the input frequency or at an intermediate frequency.

3. The peak suppression and pre-distortion circuit according to claim 1, wherein main multi-carrier input signal from the wireless transmitter is sampled using sub-harmonic sampling technique at the input frequency or at an intermediate frequency and the digitized main multi-carrier input signal is down converted digitally and decimated to the appropriate number of samples per symbol for further digital signal processing.

4. The peak suppression and pre-distortion circuit according to claim 1, wherein main multi-carrier input signal from the wireless transmitter is baseband and is sampled using Nyquist sampling technique and interpolated to produce the baseband multi-carrier signal with appropriate number of samples per symbol.

5. The peak suppression and pre-distortion circuit according to claim 1, wherein main input signals from the wireless transmitter are in bit domain and the bit domain baseband signals are up converted, combined and interpolated to produce the digital multi-carrier baseband signal with appropriate number of sample per symbol.

6. The peak suppression and pre-distortion circuit according to claim 1, wherein feedback multi-carrier input signal from the wireless multi-carrier power amplifier is sampled using sub-harmonic sampling technique at the input frequency or at an intermediate frequency.

7. The peak suppression and pre-distortion circuit according to claim 1, wherein feedback multi-carrier input signal from the wireless multi-carrier power amplifier is sampled using sub-harmonic sampling technique at the input frequency or at an intermediate frequency and the digitized feedback input signal is down converted digitally and decimated to the appropriate number of samples per symbol for further digital signal processing.

8. The peak suppression and pre-distortion circuit according to claim 1, wherein the digital multi-carrier main baseband signal is converted to single channel baseband signals by digital down conversion. The individual baseband signals are phase rotated using the phase from phase rotation lookup table, then filtered and up converted back to their original baseband frequency before all individual baseband signals being combined again to produce the multi-carrier peak suppressed baseband signal.

9. The peak suppression and pre-distortion circuit according to claim 1, wherein the peak suppressed, and pre-distorted main signal using a lookup table is digitally up converted and converted to analog domain at an intermediate frequency or the output frequency.

10. The peak suppression and pre-distortion circuit according to claim 1, wherein the digitized main signal and feedback signal are used to adaptively update the pre-distortion lookup table, wherein the main signal samples are delayed to match the samples from the amplifier feedback input before being used by lookup table adaptation algorithm, wherein the man signal samples and the amplifier feedback signal samples are gain controlled before being used by the lookup table adaptation algorithm.

11. The peak suppression and pre-distortion circuit according to claim 1, wherein the peak suppression phase rotation lookup table is created using the input and the output from the peak suppression block during the calibration.

12. The peak suppression and pre-distortion circuit according to claim 1, wherein feedback input signal from the wireless power amplifier is sampled using sub-harmonic sampling technique at the input frequency or at an intermediate frequency and the digitized feedback input signal is down converted digitally, decimated down to the appropriate number of samples per symbol with a sampling phase to allow phase alignment (in T/k steps) with the main input signal for further digital signal processing by the adaptation algorithm.

13. The peak suppression and pre-distortion circuit according to claim 1, wherein main input signal and digitized feedback input signal are aligned in amplitude by automatic gain control operations prior to further processing by the lookup table adaptive algorithm which updates the pre-distortion lookup table.

14. The peak suppression and pre-distortion circuit according to claim 1, wherein the delay described in claim 1 is measured by initially generating a digital signal with high autocorrelation property, such as a pseudo random sequence used by the main signal path, and correlation of this sequence with the amplifier output feedback signal by delay adjustment algorithm. The correlation window is incremented by adjusting the sampling phase in decimation block in the path of the amplifier output feedback signal in T/k steps by changing the coefficients of the decimation filter in the amplifier output feedback signal path, and by incrementing the delay of main input signal used by the delay adjustment algorithm by integer sample unit delays.

15. The peak suppression and pre-distortion circuit according to claim 1, wherein the digital signal processing block can be implemented in programmable logic, FPGA, Gate Array, ASIC, and DSP processor.

* * * * *